United States Patent [19]

Nakamura

[11] Patent Number: 5,210,438
[45] Date of Patent: May 11, 1993

[54] SEMICONDUCTOR RESISTANCE ELEMENT AND PROCESS FOR FABRICATING SAME

[75] Inventor: Shunji Nakamura, Yokohama, Japan

[73] Assignee: Fujitsu Limited, Kanagawa, Japan

[21] Appl. No.: 809,044

[22] Filed: Dec. 16, 1991

Related U.S. Application Data

[63] Continuation of Ser. No. 524,615, May 17, 1990, abandoned.

[30] Foreign Application Priority Data

May 18, 1989 [JP] Japan .................................. 1-125259

[51] Int. Cl.⁵ ...................... H01L 27/02; H01L 27/13
[52] U.S. Cl. ...................................... 257/536; 257/347
[58] Field of Search .................... 357/51, 23.9, 15, 71, 357/41, 65, 49, 41, 51, 59, 23.7, 2, 71, 63; 257/536–538, 347

[56] References Cited

U.S. PATENT DOCUMENTS

| | | | |
|---|---|---|---|
| 3,484,662 | 12/1969 | Hagon | 357/65 |
| 4,239,559 | 12/1980 | Ito | 357/23.9 |
| 4,489,104 | 12/1984 | Lee | 427/101 |
| 4,809,056 | 2/1989 | Shirato et al. | 357/71 |
| 4,933,730 | 6/1990 | Shirato | 357/41 |

FOREIGN PATENT DOCUMENTS

| | | |
|---|---|---|
| 0112097 | 1/1983 | European Pat. Off. . |
| 0145926 | 6/1984 | European Pat. Off. . |
| 0222215 | 10/1986 | European Pat. Off. . |
| 2548452 | 6/1984 | France . |

OTHER PUBLICATIONS

IEEE Transactions on Electron Devices "High Performance Low-Temperature Poly-Si n-Channel TFT's for LCD", Akio Mimura, et al, pp. 351-359, vol. 36, No. 2, Feb. 1989.

"Polysilicon Resistor Modification with Hydrogen Plasmas on Fabricated Integrated Circuits", D. S. Ginley et al, pp. 2078-2080, Journal of the Electrochemical Society, Aug. 1987.

*Primary Examiner*—Mark V. Prenty
*Attorney, Agent, or Firm*—Nikaido, Marmelstein, Murray & Oram

[57] ABSTRACT

A semiconductor resistance element of one electrical conduction type comprises: a semiconductor region including a first impurity of opposite electrical conduction type and second impurity of one electrical conduction type, wherein said second impurity is more heavily introduced so that a predetermined resistance is obtained; and electrode regions provided on both ends of said semiconductor region.

9 Claims, 7 Drawing Sheets

SEMICONDUCTOR RESISTANCE ELEMENT AND PROCESS FOR FABRICATING SAME

This application is a continuation of application Ser. No. 524,615 filed May 17, 1990 now abandoned.

BACKGROUND OF THE INVENTION

1. Field of the Invention

The present invention relates to a semiconductor resistance element and a process for fabricating same, and more particularly, to a semiconductor resistance element comprising impurities of one electrical conductive type and the opposite electrical conduction type in a semiconductor, and a process for the fabricating same.

2. Description of the Related Art

Among the processes for fabricating a resistance element of a semiconductor integrated circuit, one such process, as shown in FIG. 1, comprises an impurity of the opposite electrical conduction type diffused into a substrate 1 of a single crystal semiconductor of one electrical conduction type to form a diffused region 20 as a resistance element, and a process in which, as shown in FIG. 2, a polycrystalline or amorphous semiconductor film 22 on an insulating film 21 and impurities are diffused into the amorphous semiconductor film 22.

The former resistance element in FIG. 1 formed in the semiconductor substrate 1 is disadvantageous in that a PN junction is formed in the interface between the substrate 1 and the diffused region 20. The resistance element then has a parasitic capacitance, and this parasitic capacitance inhibits a high-speed operation of a transistor.

In contrast, the latter resistance element in FIG. 2 formed on the insulating film 21 is advantageous in that, since a PN junction is not formed and the resistance element is formed on the insulating film 21, the formation position is not restricted and the integration degree can be increased by reducing the occupied area on the integrated circuit.

According to the latter process, in which a resistance element is formed on the insulating film 21 after the formation of a semiconductor film 22 on the insulating film 21, an impurity of a single electrical conduction type, for example, boron (B), is diffused. According to this conventional process, however, even if an impurity is diffused under the same conditions, the resistance value is deviated due to the influence of hydrogen ($H_2$) generated by the heat treatment or plasma treatment at the subsequent step, or the influence of hydrogen generated from a material constituting a surrounding insulating film or metal wire by the subsequent step. In addition, the resistance value is varied widely by local changes.

When a second metal wire layer 25 is present on the resistance element 23 as shown in FIG. 3 as compared to when such a metal wire is not present, the resistance value after the formation of an interlayer film and the subsequent heat treatment (400° to 500° C.) is smaller where the second metal wire layer g is present, as shown in FIG. 4.

The reason for the change of the resistance value is considered to be as follows. As a result of the heat treatment after the formation of the second metal wire layer 25, a large quantity of $H_2$ is generated from the patterned second metal wire layer 25. This $H_2$ can easily intrude into the surrounding polysilicon through an insulating film 26.

On the other hand, a polycrystalline or amorphous semiconductor, for example, polycrystalline silicon or amorphous silicon, is different from a single crystal silicon, and since many dangling bonds of Si atoms are present, many localized levels are formed in the handicap, and electrons or positive holes are trapped in these localized levels.

If $H_2$ generated from the metal wire in the manner described above is caught in the polysilicon, dangling bonds are bonded with hydrogen more readily than with electrons or positive holes, with the result that the dangling bonds are inactivated.

Accordingly, the electrons or positive holes which have not been caught by the dangling bonds become free carriers, and thus the number of carriers in the silicon film is increased and the resistance value is reduced. $H_2$ is also generated from the first metal wire layer 24, but since the presence of the first metal layer 24 is common to all resistances, this $H_2$ does not provide a reason for the difference in the resistance value.

It can be considered that, when forming a resistance element, an impurity concentration is first adjusted to cope with an estimated reduction of the resistance value by a metal wire arranged in the vicinity of the resistance element or by the heat treatment temperature. However, this method is not practical for a device in which the wire layout is determined according to the requirement of a user, such as a gate array.

SUMMARY OF THE INVENTION

Accordingly, an object of the present invention is to provide a semiconductor resistance element wherein the resistance value thereof can be maintained at a constant level regardless of environmental changes such as a change of the temperature and the presence of hydrogen.

A further object of the present invention is to provide a process for fabricating the semiconductor resistance element.

According to the present invention there is provided semiconductor resistance element of one electrical conduction type comprising:

a semiconductor region including a first impurity of opposite electrical conduction type and second impurity of one electrical conduction type, wherein said second impurity is more heavily introduced so that a predetermined resistance is obtained; and electrode regions provided on both ends of said semiconductor region.

According to the present invention, there is further provided a process for the fabrication of a semiconductor resistance element, comprising the steps of:

preparing a semiconductor substrate, introducing impurities of one electrical conduction type and impurities of the opposite electrical conduction type into a region of said semiconductor substrate, heat-treating said impurity-introduced region of said semiconductor substrate, and forming electrode regions at both ends of said region of the semiconductor substrate.

According to the present invention, a resistance element is formed by introducing an impurity of one electrical conduction type and an impurity of the opposite electrical conduction type formed in a semiconductor film on an insulating substrate. For example, a film of a monocrystalline (e.g., monocrystalline silicon), polycrystalline or amorphous semiconductor is formed on an insulating film, and both N-type and P-type impurities are introduced into the semiconductor film at a concentration of about $3 \times 10^{18}$ cm$^3$.

If a resistance element is thus formed by injecting both N-type and P-type impurities, not only one carrier of an electron or a positive hole is caught by dangling bonds of atoms in the semiconductor film, but sometimes electrons are caught or positive holes are caught, and it is considered that the numbers thereof are almost equal.

Accordingly, it is considered that the carriers set free by an inactivation of dangling bonds by $H_2$ are an almost equal number of electrons and positive holes, and they negate each other and make no contribution to the conduction of electricity, and therefore, it is considered that the resistance value is little changed by $H_2$.

DESCRIPTION OF THE PREFERRED EMBODIMENTS

An example of the present invention will now be described with reference to the accompanying drawings.

Figure 5A:
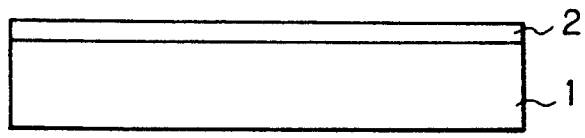
FIGS. 5A through 5K are step diagrams showing an example of the present invention, in section.

FIG. 5 is a step diagram showing one example of the present invention in section, wherein reference numeral 1 in the drawings represents a substrate composed of a semiconductor such as silicon, and a silicon dioxide (SiO$_2$) film 2 is formed on this substrate 1 by the CVD (Chemical Vapor Deposition) method and a semiconductor resistance element is formed on the silicon dioxide film [see FIG. 5A].

Figure 5B:
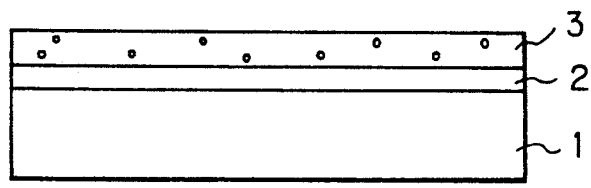
Figure 5C:
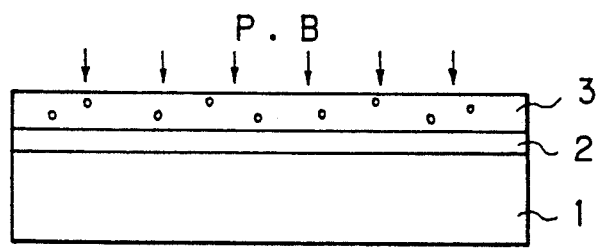
Figure 5D:
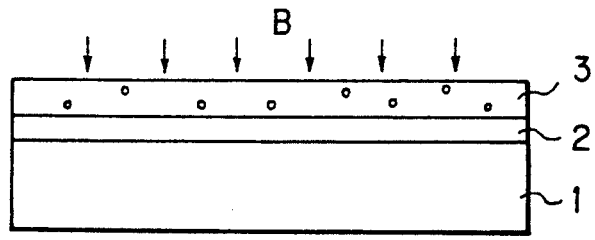

For the formation of the resistance element, a polycrystalline silicon film 3 having a thickness of, for example, about 3000 Å is laminated on the SiO$_2$ film 2 [see FIG. 5B], and a phosphorus (P) ion is implanted or injected into the polycrystalline silicon film 3 at an energy of 70 keV and a dosage of $1 \times 10^{15}$ per cm$^2$ by the ion implantation (injection) method. Then a boron (B) ion is injected at an energy of 35 keV and a dosage of $1 \times 10^{15}$ per cm$^2$ [see FIG. 5C]. The injection quantities can be appropriately changed according to the number of dangling bonds in the polycrystalline film 3 or the resistance value.

Then the second injection of an ion of B is carried out, to select the resistance value. In this case, the dosage is changed according to the resistance value [see FIG. 5D].

Figure 5E:
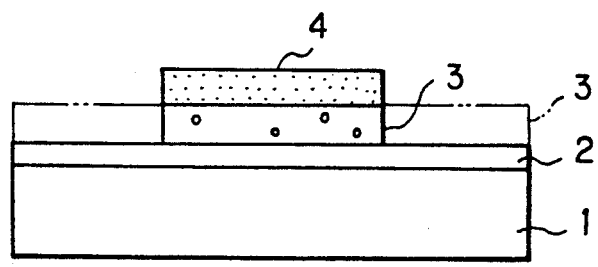

After this ion injection step, as shown in FIG. 5E, a resistance element-forming region of the polycrystalline silicon film 3 is covered with a resist mask 4, and reactive ion etching is carried out by using a gas formed by adding O$_2$ to CF$_4$, to effect a patterning of the polycrystalline film 3 to a size of 4 $\mu$m $\times$ 14 $\mu$m.

Figure 5F:
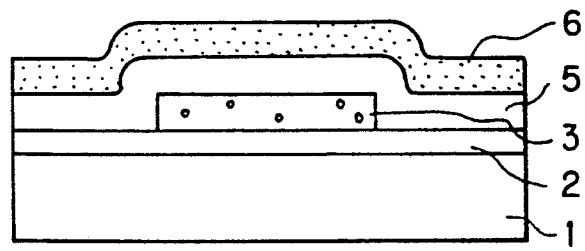

The resist mask 4 is removed and an SiO$_2$ film having a thickness of 3000 Å is formed on the patterned polycrystalline silicon film 3, and a resist 6 is coated on the SiO$_2$ film 5 [see FIG. 5F].

Figure 5G:
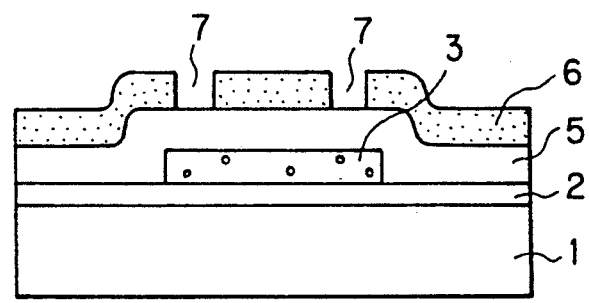
Figure 5H:
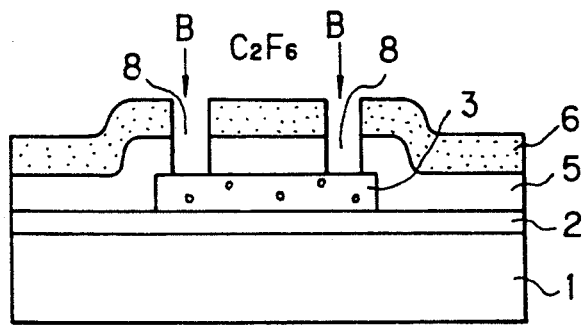

Then, as shown in FIG. 5G, two windows 7 are formed on the resist 6 at a distance of 5 $\mu$m from both side ends of the polycrystalline silicon film 3. The portions of the SiO$_2$ film exposed by the windows of the resist 6 are etched by reactive ion etching to form contact holes 8 in the SiO$_2$ film 5 [see FIG. 5H]. In this case, C$_2$F$_6$ is used as the etching gas.

Figure 5I:
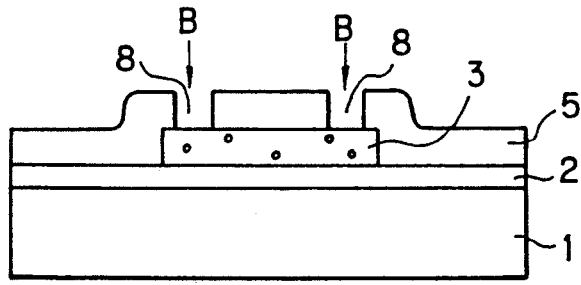

The resist 6 is removed, and an ion of B for forming a contact region is injected in the polycrystalline silicon film 3 through the contact holes 8 [see FIG. 5I]. The injection is carried out under the conditions of an energy of 35 keV and a dosage of $1 \times 10^{15}$ per cm$^2$.

Figure 5J:
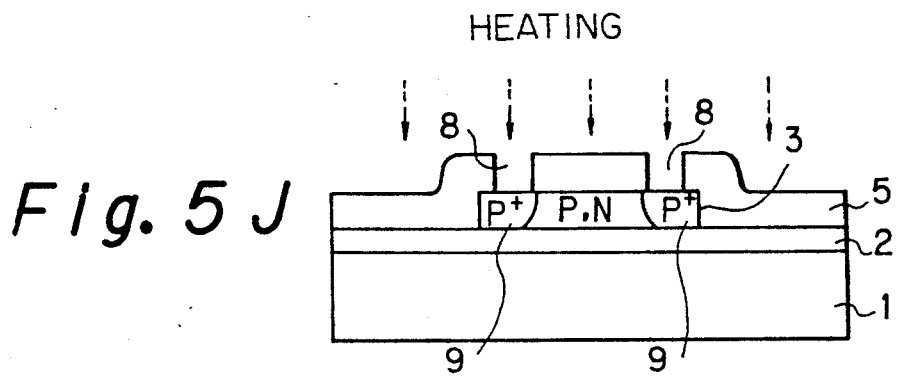

The substrate is then placed in a nitrogen atmosphere and annealed at 900° C. for 30 minutes, whereby the impurities in the polycrystalline silicon film 3 are activated and a contact region layer 9 is formed below the contact holes [see FIG. 5J].

Thereafter, a film of, for example, AlCu, having a thickness of about 1 $\mu$m is formed on the SiO$_2$ film 5 and within the contact hole 8, by the CVD method or the sputtering method, and this film is patterned by the reactive ion etching method to leave the AlCu film only on the region of the contact hole 8. This remaining AlCu film is used as an electrode 11. In this case, CCl$_4$ is used as the etching gas. Furthermore, an SiO$_2$ layer 13 is grown, for example, to a thickness of 5000 Å, by the CVD method, and then a contact hole (not shown) is formed according to need, and a film of, for example, AlCu, having a thickness of about 1 $\mu$m is formed by the gas phase growth method or sputtering method. This AlCu film is patterned by the reactive ion etching method to form a second metal wire layer (AlCu) 12.

Figure 6:
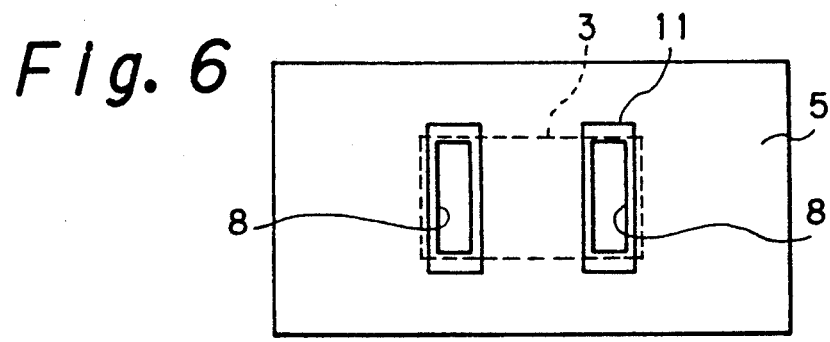
FIG. 6 is a plane view showing an example of the resistance element formed according to the present invention.

FIG. 6 is a plane view showing the state of the resistance element before the formation of the metal wire layer 12. When the resistance value of the resistance element is measured before and after the formation of the metal wire layer 12, the characteristics as shown in FIG. 7 are obtained.

Figure 5K:
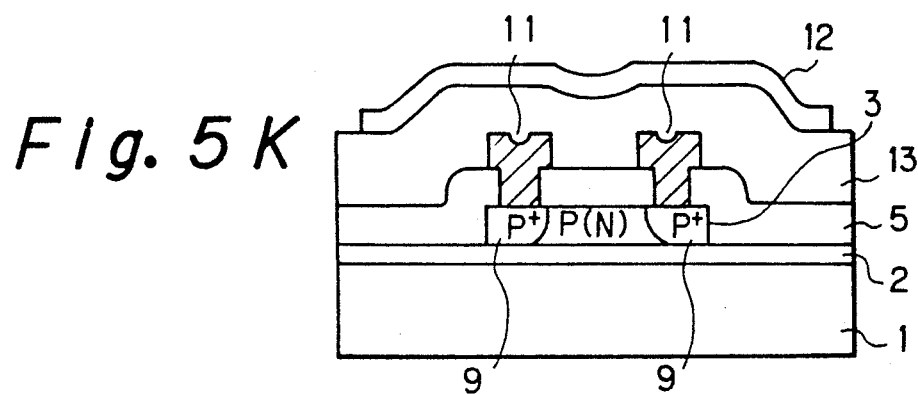
Figure 7:
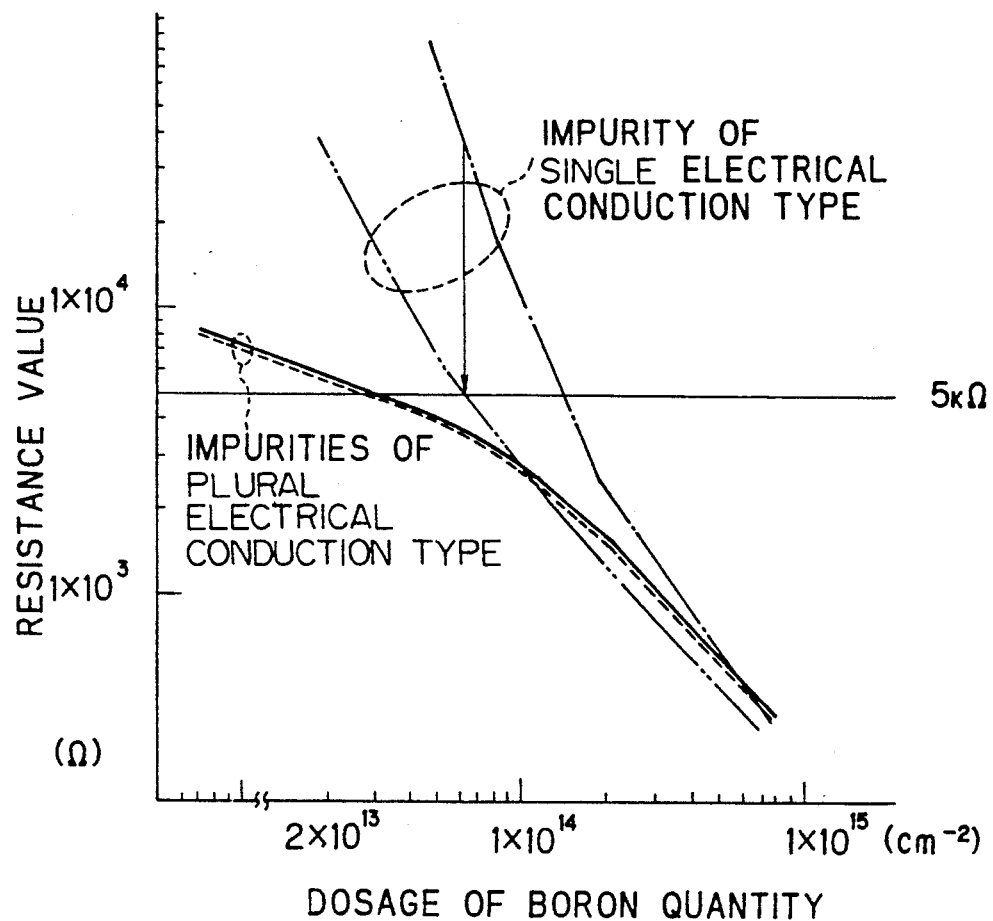
FIG. 7 is a diagram illustrating the characteristics of the resistance element according to one example of the present invention.

FIG. 7 shows the resistance characteristics, in which the dosage of boron at the second injection is plotted on the abscissa and the resistance value is plotted on the ordinate. The characteristics shown by the solid line are the resistance values measured just before the formation of the AlCu film 12 as shown in FIG. 5J. The characteristics indicated by the broken line are the resistance values measured after the formation of the AlCu film 12 and the heat treatment (about 450° C.) for forming an interlayer film, as shown in FIG. 5K.

The characteristics indicated by the one-dot chain line and two-dot chain line show the relationship between the injection quantity of the B ion and the resistance value, observed when only B ions are injected into the polycrystalline silicon film to form a resistance element according to the conventional process. The one-dot chain line shows the state just before the formation of the electrode and the two-dot chain line shows the state after the formation of the electrode and the heat treatment (about 450° C.) for forming an interlayer film.

From these measurement results, the resistance value is reduced after the electrode-forming step in both the process of the present invention and the conventional process, but the quantity of the change of the resistance value is smaller in the process of the present invention than in the conventional process.

For example, where it is desired to adjust the final resistance value after the formation of the AlCu film 12 and the interlayer insulating film to about 5 kΩ, by adjusting the injection quantity of impurities, according to the process of the present invention where both an acceptor and a donor are injected, the resistance value is not substantially different from the resistance value after the formation of the AlCu film 11. In contrast, in the conventional process in which only an acceptor is injected, the resistance value should be about 75 kΩ, and the resistance value is reduced to 1/7, to obtain a final resistance value of 5 kΩ. This reduction quantity becomes larger as the resistance value increases.

The reason for this is considered to be as follows.

Due to the low-temperature heat treatment for the formation of the insulating film after the formation of the AlCu film 12, hydrogen is generated from the AlCu film 12, and this hydrogen is readily intruded into the polycrystalline silicon film 3 through the $SiO_2$ film and the AlCu film 12. The hydrogen caught in the polycrystalline silicon inactivates the dangling bonds of the Si atom, and the carrier which has been trapped by such dangling bonds is set free. In the process of the present invention using a donor and an acceptor, the carrier thus set free includes both electrons and positive holes, and it is considered that the number of electrons and positive holes is almost equal. Accordingly, the freed electrons and positive holes negate each other and make no contribution to the conduction of electricity. Accordingly, it is construed that a resistance element that is little influenced by the presence of hydrogen can be formed.

Even in the case where only an impurity of one electrical conduction type is injected into a polycrystalline silicon film, as in the conventional process, if the impurity concentration is increased, since the ratio of the number of the carriers caught by the dangling bonds to the entire carrier number is relatively reduced, the shift quantity of the resistance value can be reduced, but since the number of carriers increases with an elevation of the impurity concentration, a high resistance value of about 10 kΩ cannot be obtained.

In contrast, in the present invention, although the impurity concentration is high, the acceptor and donor are injected substantially in the same quantities at the first injection step, and thus the number of electrons and positive holes formed in the polycrystalline film 3 is substantially equal negating each other, with the result that they apparently make no contribution to the conduction of electricity.

Accordingly, since only a small quantity of electrons or positive holes formed by the donor or acceptor introduced at the second injection step makes a practical contribution to the conduction of electricity, it is possible to increase the impurity concentration and realize a high resistance value.

In the above-explained example wherein the first and the second injection steps, i.e., two injection steps, are effected, a desired conduction type impurity having a dosage a little larger than that of the opposite conduction type impurity can be more precisely injected by injecting the dosage of the difference in the second step, than in a case where the two conduction type impurities, which have different dosages, are injected in only one step.

Figure 9:
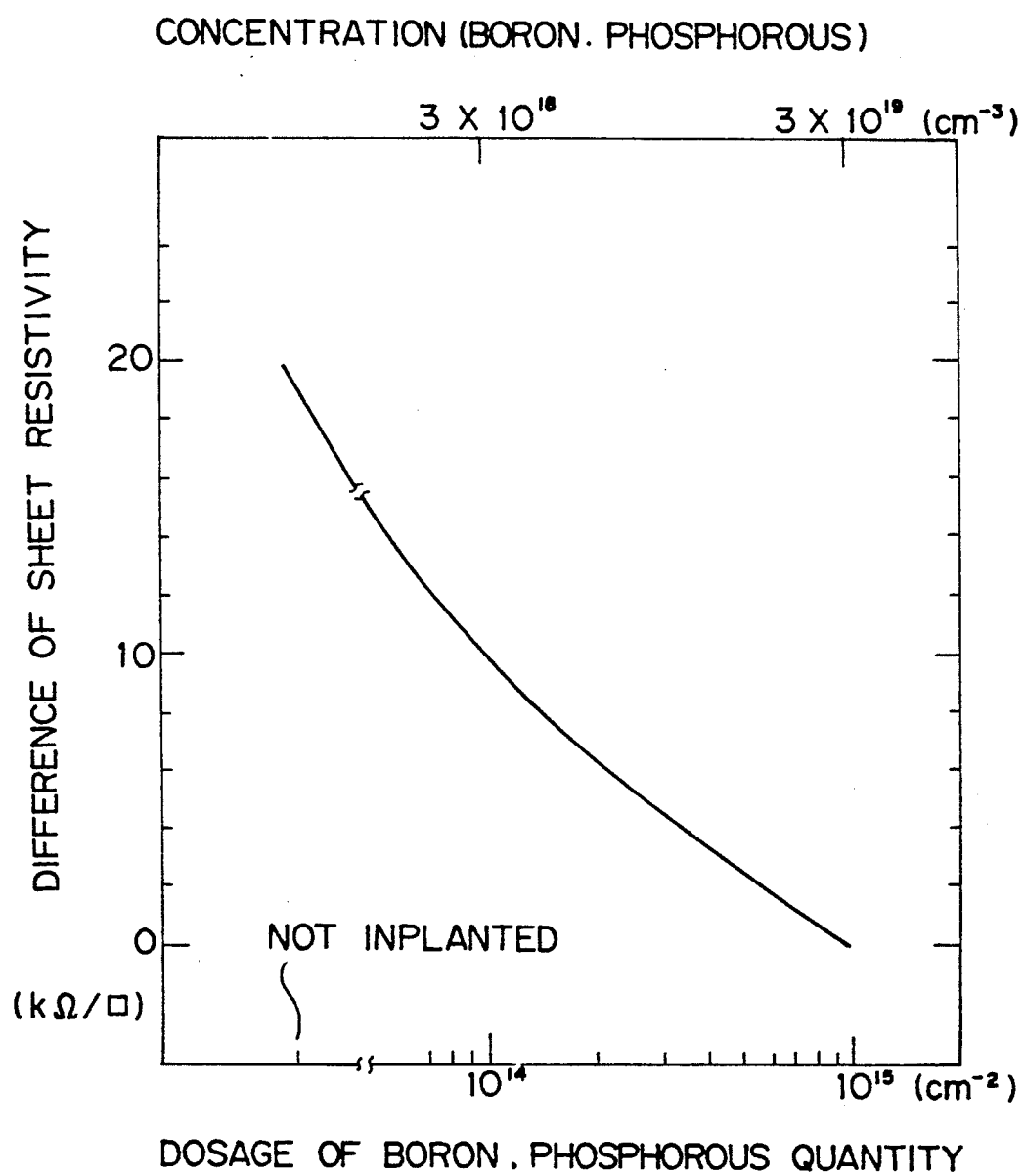
FIG. 9 is a diagram illustrating the characteristics of a resistance element.

FIG. 9 shows a diagram illustrating the characteristics of a resistance element, more particularly shows a relationship between each dosage quantity and concentration of one conductive type impurity (in this case; boron) and the opposite conductive type impurity (in this case; phosphorus), and the difference of sheet resistivity of a resistance element (type A) providing a metal film (Al) through an insulating film and a resistance element (type B) not providing a metal film through an insulating film.

After the above-mentioned boron and phosphorus impurities are introduced at the quantity shown in FIG. 9, a further, one conduction type impurity is introduced so that 5 kΩ/□ of sheet resistivity can be obtained.

When the quantity of the impurities which are simultaneously implanted it can be found from FIG. 9 that the difference of sheet resistivity of Types A and B becomes small.

In a conventional case where impurities are not simultaneously implanted the difference of sheet resistivity becomes about 20 kΩ/□.

When FIG. 9 is considered, the impurity quantity is preferably a dosage of $1 \times 10^{14}$ cm$^{-2}$ or more at which the difference of sheet resistivity becomes 10 kΩ/□ or less, namely, $3 \times 10^{18}$ cm$^{-3}$ or more as the concentration. Further to obtain a more precise resistance element the impurities are preferably implanted at a dosage of $1 \times 10^{15}$ cm$^{-2}$ at which the difference of sheet resistivity becomes about 0, namely, $3 \times 10^{19}$ cm$^{-3}$ or more.

The introduction of impurities is carried out by steps of introducing the same quantity of one conduction type and the opposite conduction type and additionally introducing a desired conduction type impurity whereby a required resistance can be obtained. Further, there may be carried out a step of simultaneously introducing one conduction type impurity and the opposite conduction type impurity, the quantity of the one conductive impurity being increased more by a required quantity than that of the opposite conduction type, whereby a required resistance can be obtained.

Figure 8:
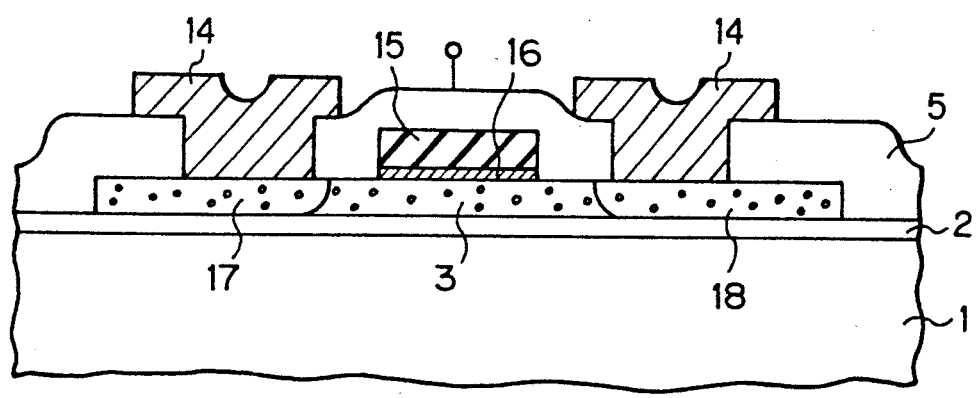
FIG. 8 is a sectional view of a TFT (Thin Film Transistor) according to the present invention.

FIG. 8 shows a sectional view of a thin film transistor (TFT) of another example as the present invention.

Figure 1:
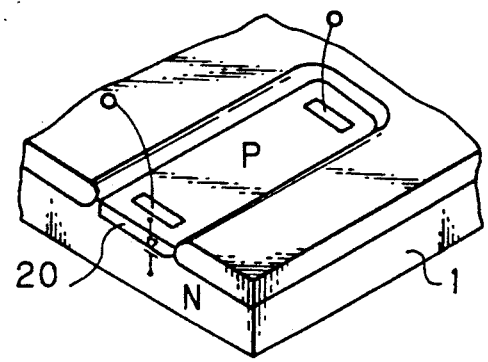
FIG. 1 is a perspective view of a resistance element fabricated by a first conventional process.
Figure 2:
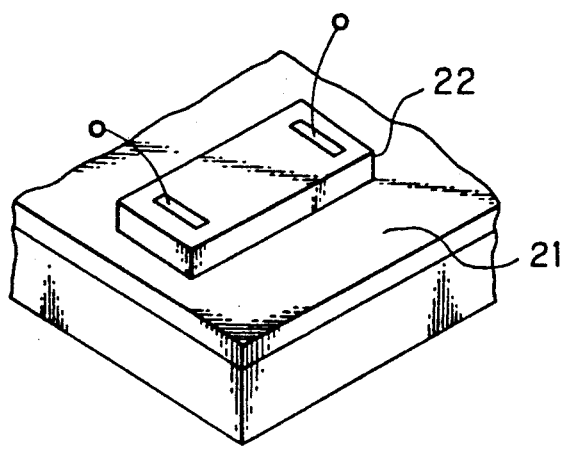
FIG. 2 is a perspective view of a resistance element fabricated by a second conventional process.
Figure 3:
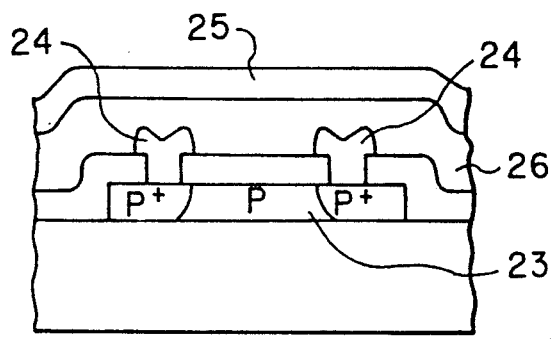
FIGS. 3 and 4 are a sectional view of a resistance element fabricated by the second conventional process and a view showing the characteristics of this resistance element.
Figure 4:
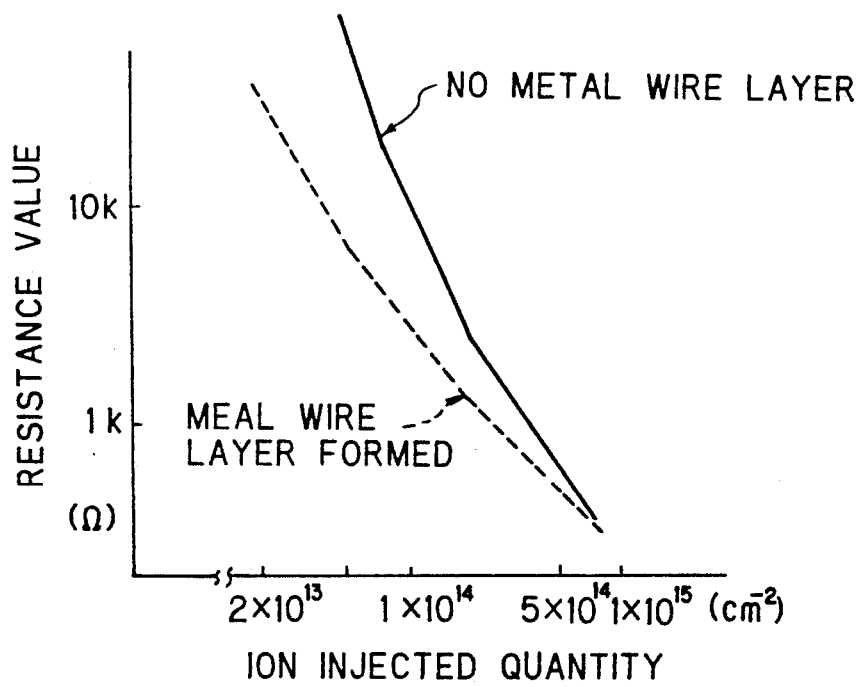

In FIG. 8, reference numerals 14 is a source/drain electrode, 15 is a gate electrode, 16 is and a gate insulating film ($SiO_2$), 17 is a source region formed on semiconductor region 3 and 18 is a drain region formed on a semiconductor region 3 respectively. The other elements are the same as those shown in FIG. 2.

The two step injection of impurity ion in the polycrystalline silicon film 3 is effected in the same manner as explained above.

In the foregoing example, a resistance element is formed by polycrystalline silicon, but amorphous silicon can be used, or other semiconductors such as germanium can be used.

Aluminum (Al) or gallium (Ga) can be used as the impurity of one electrical conduction type instead of boron (B), and as the impurity of the opposite electrical conduction type, arsenic (As) and antimony (Sb) can be used instead of phosphorus (P).

The first injection of impurities is carried out before the patterning of the polycrystalline silicon film in the foregoing example, but this injection can be carried out after such patterning.

Further, a method can be adopted in which the quantity of the impurity injected at the second injection is added to the quantity of the impurity injected at the first injection, and thus the injection of N-type ions and P-type ions can be effected at one time.

As apparent from the foregoing description, if a resistance element is formed by introducing N-type and P-type impurities into a semiconductor film formed on an insulating film, the resistance value of the resistance element can be maintained substantially at a constant level, regardless of environmental changes such as a change of the temperature and the presence of hydrogen.

The effect of diminishing the shift of the resistance value is conspicuous as the resistance value is high, and a remarkable effect is exerted in a high-resistance region.

Further, the present invention is effective for controlling variations of the resistance value due to the influence of $H_2$ during the plasma treatment, and for controlling variations of the resistance value due to $H_2$ generated from not only a metal wire as described above but also an insulating film or a passivation film, during or after the growth of the film.

I claim:

1. A semiconductor device comprising a semiconductor resistance element, said semiconductor resistance element comprising:
   a semiconductor region having a first impurity which is a first conductivity type and is introduced into said semiconductor region with a first impurity concentration and a second impurity which is introduced into said semiconductor region with a second impurity concentration, wherein the first impurity is an opposite conductivity type and said first impurity concentration is $3 \times 10^{18}$ cm$^{-3}$ or more, wherein the second impurity concentration is greater than the first impurity concentration, an entirety of said semiconductor region having the first and second introduced impurity concentrations together therein to thereby form a specific resistance, and further said semiconductor region having opposingly-located first and second ends;
   two electrode regions electrically connected to said semiconductor region, each being positioned on one of the first and second ends of said semiconductor region; and
   a wiring layer formed above said semiconductor region and extending over an entire length of said semiconductor region from the first to second ends thereof.

2. A semiconductor device which is a Thin Film Transistor (TFT), said semiconductor device comprising:
   a semiconductor region having a first impurity which is a first conductivity type and is introduced into said semiconductor region with a first impurity concentration and a second impurity which is introduced into said semiconductor region with a second impurity concentration, wherein the first impurity is an opposite conductivity type and said first impurity concentration is $3 \times 10^{18}$ cm$^{-3}$ or more, wherein the second impurity concentration is greater than the first impurity concentration, an entirety of said semiconductor region having the first and second introduced impurity concentrations together therein to thereby form a specific resistance, and further said semiconductor region having opposingly-located first and second ends;
   two electrode regions electrically connected to said semiconductor region, each being positioned on one of the first and seconds ends of said semiconductor region; and
   a wiring layer formed above said semiconductor region and extending over an entire length of said semiconductor region from the first to second ends thereof.

3. A semiconductor resistance element comprising:
   a semiconductor region having a first impurity which is a first conductivity type and is introduced into said semiconductor region with a first impurity concentration and a second impurity which is introduced into said semiconductor region with a second impurity concentration, wherein the first impurity is an opposite conductivity type and said first impurity concentration is $3 \times 10^{18}$ cm$^{-3}$ or more, wherein the second impurity concentration is greater than the first impurity concentration, an entirety of said semiconductor region having the first and second introduced impurity concentrations together therein to thereby form a specific resistance, and further said semiconductor region having opposingly-located first and second ends;
   two electrode regions electrically connected to said semiconductor region, each being positioned on one of the first and seconds ends of said semiconductor region; and
   a wiring layer formed above said semiconductor region and extending over an entire length of said semiconductor region from the first to second ends thereof.

4. A semiconductor resistance element according to claim 2, wherein said concentration of said opposite conductivity type impurity is $3 \times 10^{19}$ cm$^{-3}$ or more.

5. A semiconductor resistance element according to claim 3, wherein said semiconductor region is polycrystalline silicon.

6. A semiconductor resistance element according to claim 3, wherein said semiconductor region is a monocrystalline silicon.

7. A semiconductor resistance element according to claim 3, wherein said semiconductor region is amorphous silicon.

8. A semiconductor resistance element according to claim 3, wherein said semiconductor region is germanium.

9. A semiconductor resistance element according to claim 3, wherein one of said first impurity and said second impurity comprises at least one element selected from P, As and Sb, and the other of said first impurity and said second impurity comprises at least one element selected from B, Ga, In and Al.

* * * * *